United States Patent

Brand et al.

[11] Patent Number: 5,830,829
[45] Date of Patent: Nov. 3, 1998

[54] HIGH-TEMPERATURE SUPERCONDUCTING SOLID BODIES AND PROCESS FOR PRODUCING THEM

[75] Inventors: Markus Brand, Eppstein; Günter Brommer, Wiesbaden; Steffen Elschner, Niedernhausen; Stephan Gauss, Sulzbach; Wolf Assmus, Hanau, all of Germany

[73] Assignee: Hoechst Aktiengesellschaft, Frankfurt am Main, Germany

[21] Appl. No.: 545,775

[22] PCT Filed: Jul. 6, 1994

[86] PCT No.: PCT/EP94/02206

§ 371 Date: Nov. 27, 1995

§ 102(e) Date: Nov. 27, 1995

[87] PCT Pub. No.: WO95/02717

PCT Pub. Date: Jan. 26, 1995

[30] Foreign Application Priority Data

Jul. 17, 1993 [DE] Germany ............... 43 24 088.7

[51] Int. Cl.⁶ .................................................. C30B 23/06
[52] U.S. Cl. ..................... 505/451; 505/729; 117/83; 117/84; 117/85
[58] Field of Search ................... 505/457, 729; 117/83, 84, 85

[56] References Cited

U.S. PATENT DOCUMENTS 5,057,492 10/1991 Oka et al. ............................. 505/451
5,396,087 3/1995 Critchlaw et al. .................... 505/451
5,409,892 4/1995 Hayashi et al. ....................... 505/451
5,444,040 8/1995 Kojima et al. ........................ 505/451

OTHER PUBLICATIONS

Park, "Microstructural Properties of PF doped $YBa_2Cu_3O_{7-x}$, High Tc Superconductor Prepared by Melting Method", J. of Materials Science: Mat. in Electronics (Mar. 1993) vol. 4, No. 1, pp. 77–82 abs only.

*Primary Examiner*—Robert Kunemund
*Attorney, Agent, or Firm*—Foley & Lardner

[57] ABSTRACT

The invention relates to a process for producing textured high-temperature superconducting solid shaped parts, which comprises solid shaped parts made of oxide-ceramic superconducting material of a phase mixture of the substance class YBCO first being molded, pressed and sintered, a zonewise thermal treatment then being carried out along their longitudinal axis. Heating is first carried out, in a first zone, to a temperature in the range of from 50 to 200 K below the peritectic melting temperature of the phase mixture initially present in the shaped part, the temperature then is raised, in a second zone having a temperature gradient in the range of from 10 to 250 K/cm, then, in a third zone, a temperature of up to 50 K above the peritectic melting temperature of the phase mixture initially present in the shaped part is maintained, cooling then being carried out, in a fourth zone having a temperature gradient in the range of from 10 to 250 K/cm. Finally, in yet a fifth zone, a temperature in the range of from 50 to 200 K below the peritectic melting temperature of the phase mixture initially present in the shaped part is maintained. According to the invention, the zones are moved along in the longitudinal direction at a speed in the range of from 1 to 10 mm/h.

12 Claims, 3 Drawing Sheets

HIGH-TEMPERATURE SUPERCONDUCTING SOLID BODIES AND PROCESS FOR PRODUCING THEM

BACKGROUND OF THE INVENTION

The present invention relates to a process for producing textured high-temperature superconducting solid parts.

Oxide-ceramic high-temperature superconductors are regarded as promising materials for components or workpieces in the field of electrical engineering and electronics, since their high transition temperatures permit operation in liquid nitrogen, and cooling with liquid helium is unnecessary. A precondition for their wide cost effective use, however, is a high critical current density $j_c$.

Processes for producing superconducting components having high critical current densities already exist. Thus, superconducting layers of the compounds $YBa_2Cu_3O_x$ (YBCO 123) and $Bi_2Sr_2CaCu_2O_x$ (BSCCO 2212) can be deposited on monocrystalline substrates made of $SrTiO_3$ or MgO and there permit current densities $j_c$ of $\geq 10^6$ A/cm$^2$. The components thus obtained however have the drawback of limited conductor length and small absolute currents. With the "powder-in-tube" method, high current densities in the range of $\geq 5 \cdot 10^4$ A/cm$^2$ are likewise achieved. This process has been carried out successfully with compounds of the type BSCCO 2212 and BSCCO 2223 (see B. Hensel et al. in Physica C 205 (1993) 329–337). The resulting specimens likewise only have relatively low absolute currents and in addition inevitably carry a silver sheath around the superconducting core. For a number of engineering applications such as supply leads or current limiters, the said silver sheath is undesirable or causes problems.

If components are fabricated in accordance with shaping processes conventional in industrial ceramics, so far only low critical transport current densities of not more than 1000 A/cm$^2$ are achieved. The cause of this are the weak links between the individual superconducting grains. Within the scope of the invention, the term c axis refers to the crystallographic axis perpendicular to the CuO planes in the superconducting crystals, whereas a and b designate the axes in the CuO planes. According to the studies by Dimos et al. in Physical Review B, Vol. 41, (1990), 4038–4049, the critical transport current density in oxide-ceramic superconducting material of the substance class YBCO depends sensitively on the angles between the crystallographic axes of individual crystallites. The smaller the angles, the larger the critical transport current density. The most favorable arrangement is a so-called "two-axes texture", i.e. the respective crystallographic axes of all the crystallites are parallel to one another, while at the same time the (a, b) planes are aligned along the superconducting current direction.

SUMMARY OF THE INVENTION

The object of the present invention is therefore to provide a suitable process by means of which the crystallites of a component can be oriented as parallel as possible with respect to one another and along the current direction, and by which it is therefore possible to produce solid shaped parts made of oxide-ceramic superconducting material, which permit critical transport current densities of more than 10,000 A/cm$^2$.

This object is achieved by a process of the generic type mentioned in the preamble, whose distinguishing features should be seen in solid shaped parts, which comprises solid shaped parts made of oxide-ceramic superconducting material of a phase mixture of the substance class YBCO first being molded, pressed and sintered, a zonewise thermal treatment then being carried out along their longitudinal axis, heating first being carried out, in a first zone, to a temperature in the range of from 50 to 200 K below the peritectic melting temperature of the phase mixture initially present in the shaped part, the temperature then being raised, in a second zone having a temperature gradient in the range of from 10 to 250 K/cm, then, in a third zone, a temperature of up to 50 K above the peritectic melting temperature of the phase mixture initially present in the shaped part being maintained, cooling then being carried out, in a fourth zone having a temperature gradient in the range of from 10 to 250 K/cm, and finally, in a fifth zone, a temperature in the range of from 50 to 200 K below the peritectic melting temperature of the phase mixture initially present in the shaped part being maintained, and moving the zones along in the longitudinal direction at a speed in the range of from 1 to 10 mm/h.

DETAILED DESCRIPTION OF A PREFERRED EMBODIMENT

Shaped parts produced according to the invention preferably have the geometry of bars having a length of up to 1 m and a diameter in the range of from 1 to 50 mm. The starting material for the bars preferably is a mixture of YBCO 123 containing from 12 to 28 mol% of YBCO 211, based on the total molar amount of superconducting material. Fine dispersion of the additions of YBCO 211, with a mean particle diameter of $\leq 1$ μm, is beneficial. The additional admixture of $PtO_2$ of from 0.5 to 10 mol%, based on the total molar amount of superconducting material, finely dispersed with a mean particle diameter of <50 μm, prevents undesirable rimming on the side of the sintered starting material during the zonewise thermal treatment. $PtO_2$ is to be preferred to pure Pt, because the oxide makes it possible to achieve a finer dispersion of the metal in the starting material.

The bars, first sintered up to a density of 90%, preferably up to 92% of the theoretically possible density, are mounted, for the purpose of carrying out the process according to the invention, longitudinally on a ceramic bar and introduced into a zone-melting oven having 5 temperature zones (I to V) which can be adjusted independently of one another. The temperatures in the various zones are adjusted in such a way that in zone III (hot zone) there prevails a temperature just above, and in the zones I and V there prevail temperatures below the peritectic melting temperature of the phase mixture initially present in the sintered shaped part. The peritectic melting temperatures of mixtures of the composition preferred according to the invention normally are in the range from 950° to 1050° C. In the zones II and IV, a steep temperature gradient of preferably from 100 to 250 K/cm is set. The shaped part is first positioned in the oven in such a way that its one end is situated in the hot zone and partially melts. Then, the shaped part is slowly pulled through the hot zone. If the process is carried out according to the invention, it is found that that part of the specimen which has already passed through the hot zone, is highly textured, i.e. the crystallographic axes of the crystallites in the shaped part are aligned parallel to one another.

Figure 1:
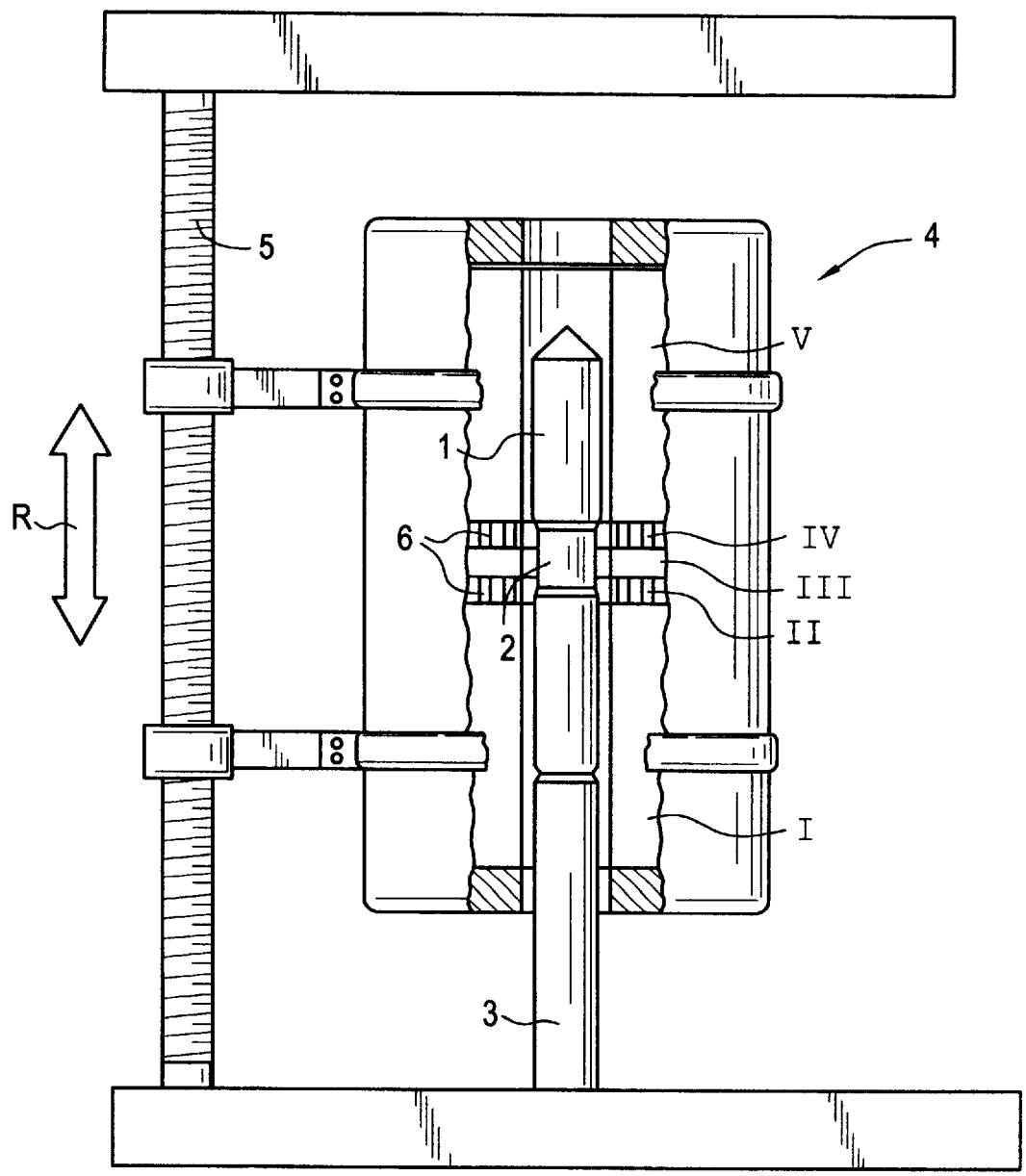
FIG. 1 is a schematic diagram of a zone-melting system in accordance with the present invention.
Figure 2:
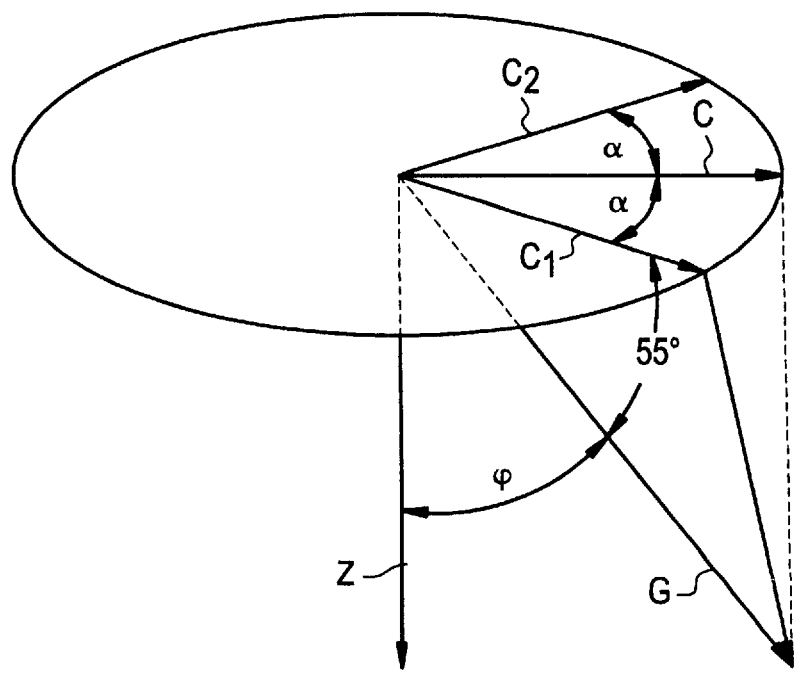
FIG. 2 shows crystallite orientation of a superconductor in accordance with the present invention.

FIG. 1 shows a schematic diagram of a zone-melting oven as is typically suitable for carrying out the process according to the invention. Reference symbols are used to indicate the shaped part 1, the melting zone 2 and the specimen holder 3. The zone-melting oven itself 4 is disposed on a holder 5 so as to be mobile in the direction of movement R. The temperature gradient in the zones II and IV can be adjusted with the aid of cooling fins 6 which are made of alloys having a particularly high thermal conductivity.

Shaped parts produced according to the process of the invention can already be loaded with a high critical transport current density of 13,000 A/cm². It is found, however, that the direction of the (a, b) planes aligned in parallel does not yet necessarily have the optimal orientation parallel to the intended current direction, i.e. parallel to the bar axis. When the process according to the invention is carried out as explained above, there always results an angle of 55° between the bar axis and the c axes, arranged parallel with respect to one another, of the crystallites. This means that the angle between the (a, b) planes of the crystallites and the bar axis equals 90°−55°=35°. This is a consequence of the isotropic thermal conductivity within the crystallites being formed, the radial temperature gradient of the oven also having to be taken into account. Surprisingly, two independent procedures were found by means of which, in each case, optimum orientation of the (a, b) planes, arranged parallel to one another, of the crystallites with respect to the flow direction of the current in the longitudinal direction of the bar is achieved at the same time. This corresponds to an angle between the c axes and the bar axis of 90°.

According to the first procedural version, in the above-described process, the one end of the specimen is first moved into the hot zone. Then, the specimen is pulled through the hot zone. Initially, a large number of independently oriented nuclei are formed. By virtue of natural nucleus selection, one of these nuclei prevails, normally the one with the 55° orientation. After as little as a few cm, the specimen is textured in accordance with this nucleus. In order to prevent the natural nucleus selection, which evidently always results in the 55° orientation, the bar to be treated is first pointed, and on the point a small single crystal is fixed in the desired orientation. The specimen is then moved into the hot zone of the oven in such a way that partial melting of the seed crystal takes place. This crystal then presets, as an artificial nucleus, the orientation of the texture.

According to the second procedural version, the temperature gradient between the hot zone and the textured part of the specimen is oriented obliquely with respect to the specimen axis. This can be effected, for example, by a suitable arrangement, e.g. oblique position, of the cooling fins responsible for adjusting the temperature gradient in the longitudinal direction. Let the corresponding angle be designated by φ (0°<φ<90°). crystallites. This domain then grew down to the end of the bar. Micrographs at various points of this textured domain unambiguously indicated complete texturing.

Figure 3:
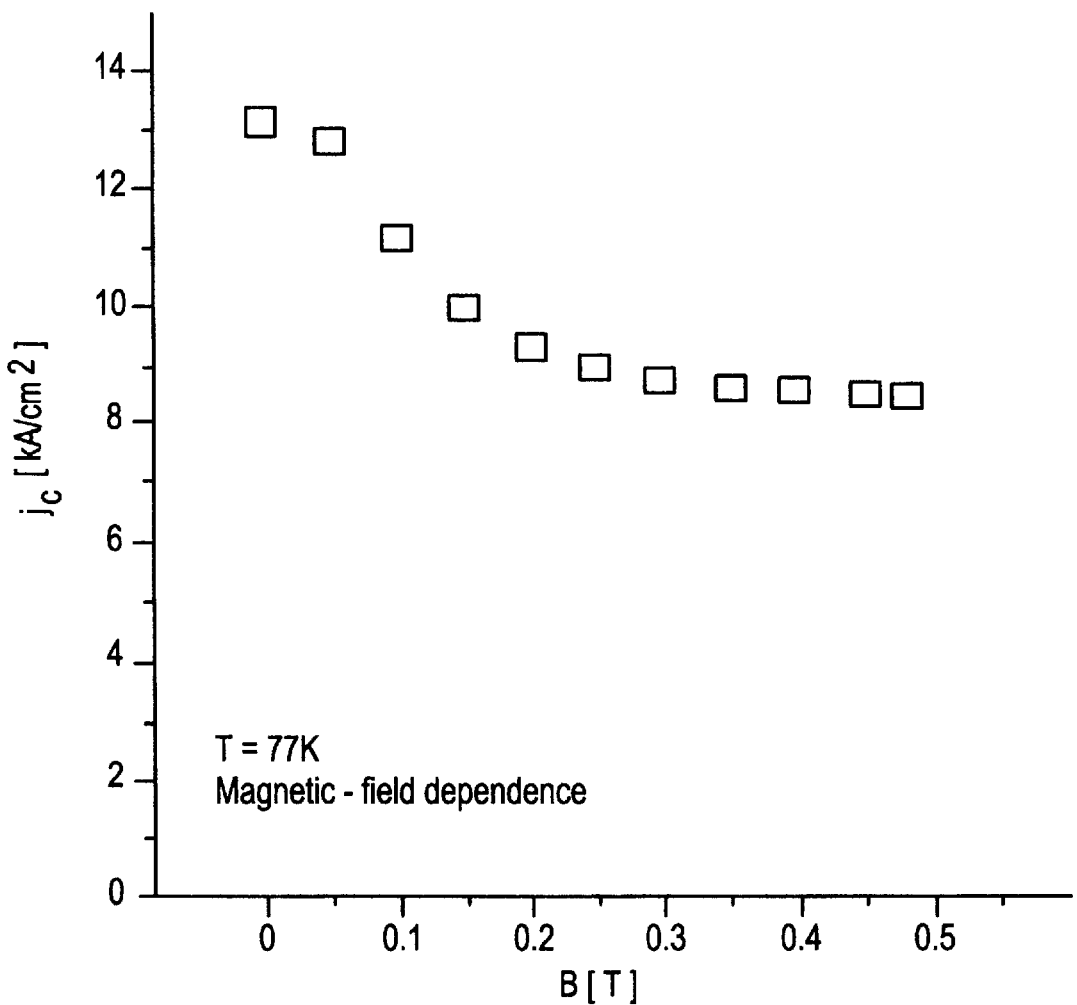
FIG. 3 shows the critical transport current density 4-point method as related to magnetic field.

After the required oxygen treatment over a time of 72 h at a temperature of 450° C., there was cut, from the textured part of the bar, a small rod having the dimensions 45×2×2 mm, which was measured by means of the conventional 4-point method. To this end, the small rod was clamped into a heavy-current generator designed for a current intensity of 500 A. The current was fed in via the outer ends of the small rod, and the voltage was measured at two contacts, spaced by 4 cm, on the small rod. A critical temperature $T_c$ of 92 K was found. FIG. 3 shows the results of a series of measurements of the critical transport current density $j_c$ as a function of the magnetic field at T=77 K. The critical transport current density was calculated from the current which caused a voltage drop of precisely 1 µV/cm. Without a magnetic field, a critical transport current density of 13,000 A/cm² was achieved (FIG. 3) and for a magnetic field with H=0.5 T perpendicular to the current direction, $j_c$ still was 10,000 A/cm². The high critical transport current density as well as its but low dependence on the magnetic field show that it is possible, according to the procedure of the invention, to achieve uniform texturing.

EXAMPLE 2

The blank was initially prepared in the same way as in Example 1. Prior to the sintering operation, however, the pressed specimen was sharpened to a point. On its point, a nucleus was attached, the longitudinal axis of its crystallites being perpendicular to the bar axis, and sintered together with the blank. Thus, the c axes of the crystallites of the nucleus are, as desired, perpendicular to the bar axis. The nucleus was obtained by section of a grain from a previous experiment. The temperature gradient was adjusted in such a way that, with respect to the bar axis, it adopted an angle of 35°, its horizontal component being parallel to the c axis of the nucleus. The specimen was then introduced into the (tilted) hot zone III in such a way that the nucleus was fused on in part, but not completely. The same procedure was then followed as in Example 1, i.e. the specimen was pulled through the hot zone at a speed of 1 mm/h. Emanating from the nucleus, the entire specimen crystallized in the desired orientation. The specimen was characterized in a manner analogous to that of Example 1, except that the critical transport current density was so high that it could not be determined with the equipment available. ($j_c$>20,000 A/cm²).

We claim:

1. A process for producing textured high-temperature superconducting solid shaped parts having a critical current density without a magnetic field of at least 10,000 A/cm², comprising molding, pressing and sintering solid shaped parts made of oxide-ceramic superconducting material of a phase mixture of YBCO 123 and YBCO 211, carrying out a zonewise thermal treatment along the longitudinal axis of said parts, by heating in a first zone, to a temperature in the range of from 50 to 200 K below the peritectic melting temperature of the phase mixture initially present in the shaped part, the temperature then being raised, in a second zone having a temperature gradient in the range of from 10 to 250 K/cm, then, in a third zone, a temperature of up to 50 K above the peritectic melting temperature of the phase mixture initially present in the shaped part being maintained, cooling then being carried out, in a fourth zone having a temperature gradient in the range of from 100 to 250 K/cm, and finally, in a fifth zone, a temperature in the range of from 50 to 200 K below the peritectic melting temperature of the phase mixture initially present in the shaped part being maintained, and moving the zones along in the longitudinal direction at a speed in the range of from 1 to 10 mm/h.

2. The process as claimed in claim 1, wherein the shaped parts have the geometry of bars having a diameter in the range of from 1 to 50 mm and a length of up to 1 m.

3. A process for producing textured high-temperature superconducting solid shaped parts having a critical current density without a magnetic field of at least 13,000 A/cm², comprising molding, pressing and sintering solid shaped parts made of oxide-ceramic superconducting material of a phase mixture of YBCO 123 and YBCO 211, wherein the shaped parts have the geometry of bars having a diameter in the range of from 1 to 50 mm and a length of up to 1 m, wherein the starting material used for the bars is a mixture of YBCO 123 containing from 12 to 28 mol % of YBCO 211, based on the total molar amount of superconducting material, carrying out a zonewise thermal treatment along the longitudinal axis of said parts, by heating in a first zone, to a temperature in the range of from 50 to 200 K below the peritectic melting temperature of the phase mixture initially present in the shaped part, the temperature then being raised, in a second zone having a temperature gradient in the range of from 10 to 250 K/cm, then, in a third zone, a temperature of up to 50 K above the peritectic melting temperature of the phase mixture initially present in the shaped part being maintained, cooling then being carried out, in a fourth zone having a temperature gradient in the range of from 100 to 250 K/cm, and finally, in a fifth zone, a temperature in the range of from 50 to 200 K below the peritectic melting temperature of the phase mixture initially present in the shaped part being maintained, and moving the zones along in the longitudinal direction at a speed in the range of from 1 to 10 mm h.

4. The process as claimed in claim 3, wherein additions of YBCO 211 are used in fine dispersion of $\leq 1$ μm.

5. The process as claimed in claim 1, wherein the starting material for the shaped parts is additionally admixed with $PtO_2$ of from 0.5 to 10 mol %, based on the total molar amount of super-conducting material, with a mean particle diameter of <50 μm.

6. The process as claimed in claim 1, wherein the solid shaped parts, prior to the zone-wise thermal treatment, are first sintered up to a density of 92% of the theoretically possible density.

7. The process as claimed in claim 1, wherein there is set, in the fourth zone, a temperature gradient of from 50 to 200 K/cm.

8. The process as claimed in claim 1, wherein, prior to the zonewise thermal treatment, the shaped part is sharpened to a point at one end and there is attached, on the point, a single crystal in the desired orientation.

9. The process as claimed in claim 1, wherein the temperature gradient in the fourth zone is rotated at an angle in the range of from 25° to 70° obliquely with respect to the longitudinal axis of the shaped part.

10. A high-temperature superconducting solid oxide-ceramic shaped part produced according to a process as claimed in claim 1, which has a critical transport current density $j_c$ of at least 12,000 A/cm$^2$ for a voltage drop of 1 μV/cm without a magnetic field, and a length of at least 4 cm.

11. A high-temperature superconducting solid oxide-ceramic shaped part provided in a bar-type geometry according to a process as claimed in claim 1, which has a critical transport current density $j_c$ of at least 12,000 A/cm$^2$ for a voltage drop of 1 μV/cm without a magnetic field, and an angle between the c axes of the crystallites and the bar axis of 55°.

12. A high-temperature superconducting solid oxide-ceramic shaped part produced according to a process as claimed in claim 1, which has a critical transport current density $j_c$ of at least 12,000 A/cm$^2$ for a voltage drop of 1 μV/cm without a magnetic field, and an angle between the c axes of the crystallites and the bar axis of 90°.

* * * * *